United States Patent [19]

Peugh

[11] 4,083,426

[45] Apr. 11, 1978

[54] LOUD SPEAKER APPARATUS

[76] Inventor: H. Mark Peugh, Box 3652, Vail, Colo. 81657

[21] Appl. No.: 621,159

[22] Filed: Oct. 9, 1975

Related U.S. Application Data

[63] Continuation-in-part of Ser. No. 515,544, Oct. 17, 1974, abandoned.

[51] Int. Cl.[2] .......................... H05K 5/00; A47B 81/06

[52] U.S. Cl. .................................... 181/156; 181/144; 181/150; 181/155; 181/199

[58] Field of Search ................................ 181/144-155, 181/199

[56] References Cited

U.S. PATENT DOCUMENTS

| | | | |
|---|---|---|---|
| 2,138,717 | 11/1938 | Volk | 181/151 |
| 2,878,887 | 3/1959 | Potter | 181/152 |
| 2,915,588 | 12/1959 | Bose | 181/147 |
| 2,955,669 | 10/1960 | Rice | 181/199 |
| 2,993,556 | 7/1961 | Wente | 181/147 |
| 3,500,953 | 3/1970 | Lahti | 181/153 |
| 3,554,314 | 1/1971 | Schneiderwind | 181/199 |

*Primary Examiner*—Stephen J. Tomsky
*Attorney, Agent, or Firm*—Phillip A. Rein

[57] ABSTRACT

The invention relates to a loud speaker system, and more particularly, the utilization of space to the utmost of efficiency for the reproduction of sound. The single unit of a loud speaker apparatus is most effectively mounted at the 90° intersection of adjacent walls and ceiling, cater-corner across the ceiling to another single unit. The single unit application is limited in that a square corner is necessary to transmit the horn properly throughout the listening chamber, yet by using multi-unit configurations with a plurality of the loud speaker apparatuses, the invention will also conform to two adjacent walls, or a flat surface, or to be suspended within the listening enclosure.

8 Claims, 8 Drawing Figures

LOUD SPEAKER APPARATUS

CONTINUATION-IN-PART

This application is a continuation-in-part of the applicant's co-pending patent application, Ser. No. 515,544; filed Oct. 17, 1974; entitled "THE IMP", now abandoned.

Numerous types of speaker structures are known to the prior art but none are constructed in such a manner to be readily mounted in a corner utilizing a pair of speakers to achieve a full range of audio waves. Also, the prior art speaker structures fail to present an attractive, modernistic appearance.

One object is to provide a loud speaker apparatus having cooperating sidewalls and baffles so constructed and arranged that the radiation of the unit encompasses the entire listening room enclosure.

Another object of this invention is to provide a loud speaker apparatus that is compact in structure and having a pair of speakers therein placed so as to obtain maximum reflection and use of adjacent wall areas in a corner mounted position.

One other object of this invention is to provide a loud speaker apparatus that is economical to manufacture, easy to mount, attractive in appearance, and sturdy in construction.

The combination of directly radiated high-frequency audio waves and indirect corner-horn radiation of the bass to middle-range, hereafter referred to as full-range audio waves, is not a new concept, yet previous art has limited the projection of sound to either a single plane or a two-dimensional reflection system whereas this invention encompasses the entire dimensions of the room enclosure forming an acoustic chamber driver able to reproduce all audible sound waves without producing any large standing waves or dead-sound spots within the enclosure.

According to the present invention, the housing and baffle form the beginning of the reflection for the low to middle-pass filter which limits the bass and mid-range efficiency to an order of magnitude comparable to the high-range efficiency of the direct radiation action. The front panel of the housing has an opening therein, and a high range driver unit is mounted, through which the treble sound radiation leaves the housing. The side panels of the housing extend diversely toward an adjacent wall or ceiling forming divisions in the horn portions of the speaker, and to form with the front panel an acoustic capacitance in the form of an unobstructed cavity. At the beginning of the 'horn' an acoustic inertance is provided in the form of a constructed opening or orifice, through which the bass to midle-range sounds enter the horn. Thus, the cavity and the orifice forms the low to middle-pass filter for the bass to middle-range audio waves, dispersing the sound throughout the listening enclosure.

In one preferred embodiment, a loud speaker apparatus of this invention includes a speaker means mounted within a housing means. The housing means includes a housing assembly, a housing door connected to one end of the housing assembly and a baffle assembly mounted against the housing door. The baffle assembly is of an irregular shape in three sections to be mounted within a corner of a room to reflect sounds against adjacent wall surfaces. The speaker means includes a full range driver speaker mounted against the housing door and a high range tweeter speaker mounted against a grill member secured to a forward portion of the housing assembly.

In other embodiments of this invention, a plurality of loud speaker apparatus units are combined for mounting against flat surfaces or suspended from a ceiling. A two or four unit assembly of loud speaker apparatuses can be secured to a wall surface for increased output. Also, a group of eight loud speaker apparatuses can be clustered in a circular fashion and supported from a ceiling in the center of a room for maximum sound output and quality reproduction.

Various other objects, advantages, and features of the invention will become apparent to those skilled in the art from the following discussion, taken in conjunction with the accompanying drawings, in which.

Figure 1:
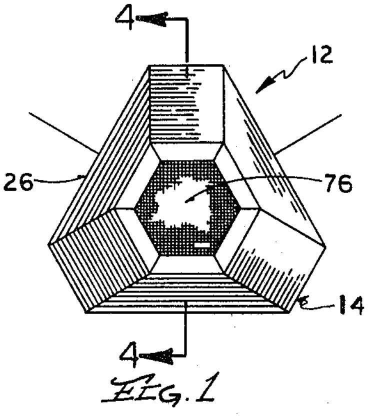
FIG. 1 is a perspective view of a loud speaker apparatus of this invention shown as mounted in the corner of a room.

The following is a discussion and description of preferred specific embodiments of the new loud speaker apparatus of this invention, such being made with reference to the drawings, whereupon the same reference numerals are used to indicate the same or similar parts and/or structure. It is to be understood that such discussion and description is not to unduly limit the scope of the invention.

In the first embodiment of the invention which is illustrated in FIGS. 1 to 5 of the drawings, there is shown a generally truncated hexagonal pyramid shaped loud speaker apparatus 12 including a housing means 14 having a speaker means 16 mounted therein. The housing means 14 is symmetrically disposed with respect to proximate surfaces and the adjacent walls of a room meeting in a 90° corner being the ceiling 18 and intersecting side walls 20 and 22. The speaker means 16 includes a full range driver speaker placed within the housing means 14 with which the only direction of radiation is through an orifice reflecting the sound waves and then off of the adjacent walls in order to lengthen the sound waves. In utilizing all surfaces of the housing means 14 for sound wave deflection, the reproduction approaches actual fidelity retaining excellent balance throughout the listening chamber.

The housing means 14 includes a main housing assembly 26; a housing door 28 connected to the housing assembly 26; and a baffle assembly 30 connected to the housing door 28. The housing assembly 26 is of generally hexagonal shape including primary or connector sidewalls 32 and interconnected secondary sidewalls 34, collectively forming a somewhat pyramid shaped structure.

The plurality of primary sidewalls 32, namely three, are of a rectangular shape having inner end portions 36 adapted to contact surfaces of the ceiling 18 and sidewalls 20 and 22 as shown in FIG. 1. Outer end portions 38 are placed in a common plane having a central axis aligned with the exact corner in the room with the axis angularly equal distant from the ceiling 18 and sidewalls 20, 22.

The plurality of secondary sidewalls 34, namely three, are of generally triangular in shape each having opposite end surfaces 40 in common planes with those of the inner end portions 36 and respective outer end portions 38 of the primary sidewalls 32. It is noted that the primary sidewalls 32 and secondary sidewalls 34 cooperate to form a central cavity to receive the speaker means 16 therein having a small forward opening 41 and a maximum opening 43 facing the junction of the ceiling 18 and the sidewalls 20, 22.

Figure 4:
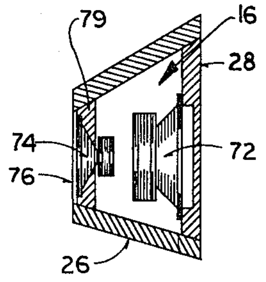
FIG. 4 is a fragmentary sectional view of the loud speaker apparatus of this invention without the baffle assembly taken along lines 4—4 in FIG. 1.
Figure 5:
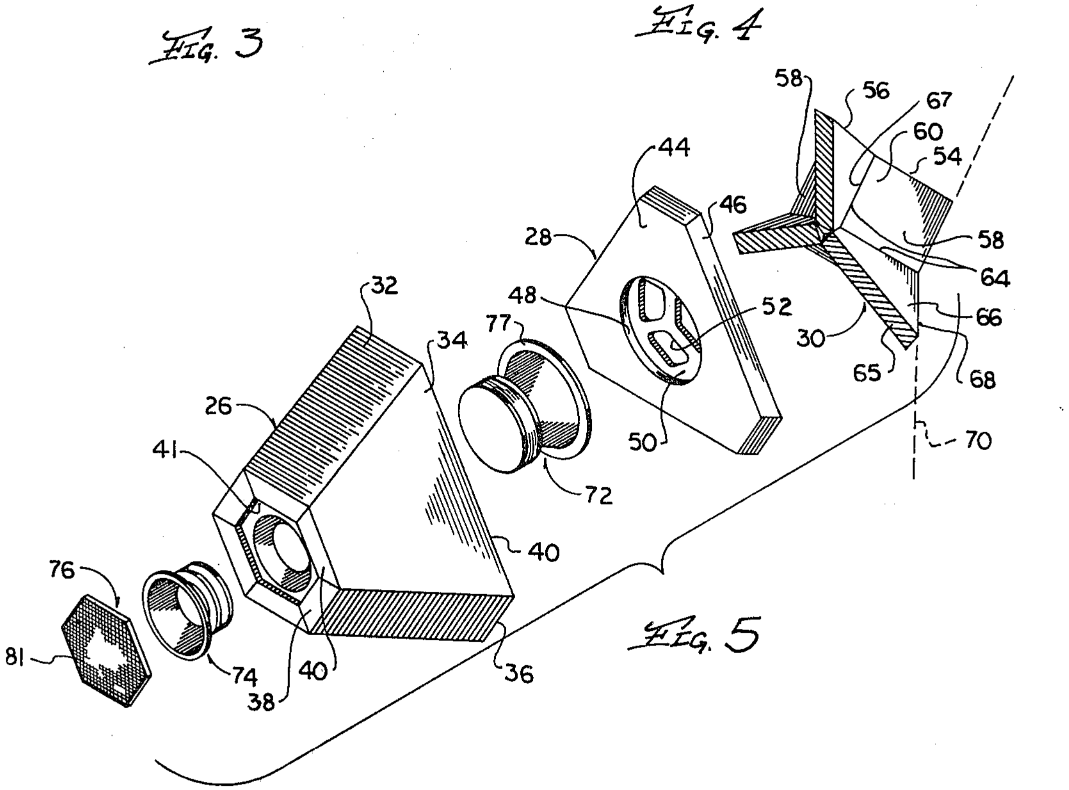
FIG. 5 is an exploded perspective view of the loud speaker apparatus of this invention.

As shown in FIGS. 4 and 5, the housing door 28 includes a main body 44 having a hexagonal, peripherial contour edge 46 with a central opening 48 and a speaker shield 50 covering part of the central opening 48. The contour edge 46 is operable to close the maximum opening 43 of the housing assembly 26 to direct sound vibrations toward the speaker shield 50. The speaker shield 50 is formed with generally rectangular shaped speaker openings 52 being spaced to cooperate with the baffle assembly 30 as will be described.

Figure 2:
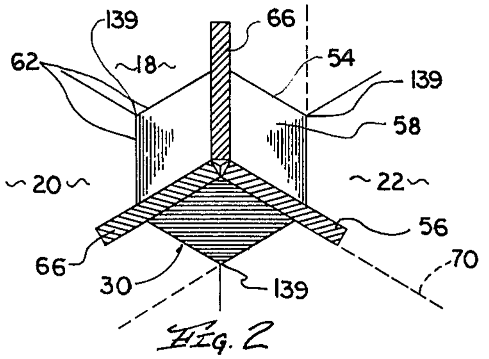
FIG. 2 is a perspective view of a baffle assembly of a loud speaker apparatus of this invention illustrated as mounted in the corner of a room.
Figure 3:
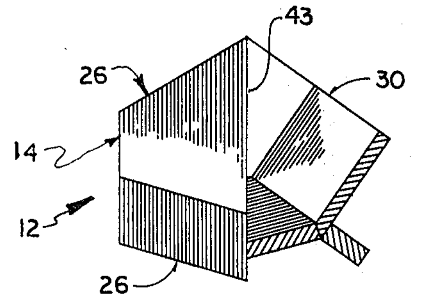
FIG. 3 is a side elevational view of the loud speaker apparatus of this invention.

As shown in FIG. 2 and FIG. 5, the baffle assembly 30 includes a corner connector assembly 54 connected to a support and separator assembly 56. The corner connector assembly 54 includes three cooperating reflector plate members 58, each of square shape to contact each other and adjacent portions of the ceiling 18 and sidewalls 20, 22 to form a cube area or connector corner therebetween. Each reflector plate members 58 includes a main body section 60 having two adjacent outer edges 62 contacting the ceiling 18 or sidewalls 20, 22, and two other adjacent outer edges 64 secured to similar portions of abutting reflector plate members 58.

The support and separator assembly 56 includes a plurality, namely three, separator plate members 66 of generally triangular shape, each having a base edge 65 connected to the housing door 28 and an inclined edge 67 connected to a pair of abutting ones of the reflector plate members 58. Also, each reflector plate member 58 has another inclined edge 68 cooperating with adjacent outer edges 62 of abutting ones of the reflector plate members 58 and being in a common plane indicated at 70. The common plane 70 is operable to be flat against the ceiling 18 or sidewalls 20, 22 in a manner to be explained.

The speaker means 16 includes the full range driver speaker 72; a high range tweeter speaker 74; and a grill member 76. The driver speaker 72 is of a conventional nature having a support ring 77 secured by screw members or other connectors to the housing door 28 about the speaker shield 50 to direct sound vibrations through the speaker openings 52 to the baffle assembly 30.

The high range tweeter speaker 74 is of a conventional type mounted in the forward end of the housing means 14 by the grill member 76 to direct sound vibrations outwardly.

The grill member 76 includes a hexagonal shaped support board 79 having the tweeter speaker 74 secured thereto and covered by a grill cloth 81.

Figure 8:
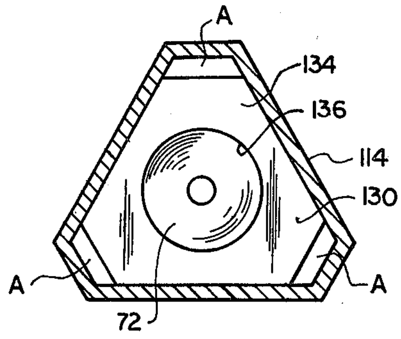
FIG. 8 is a sectional view taken along line 8—8 in FIG. 7.
Figure 7:
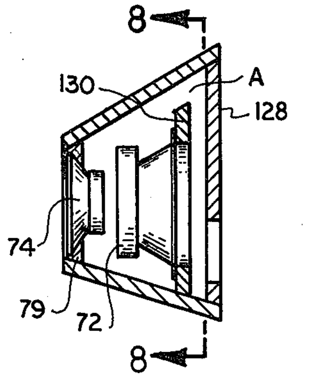
FIG. 7 is a sectional view similar to FIG. 4 of the second embodiment of the loud speaker apparatus of this invention.
Figure 6:
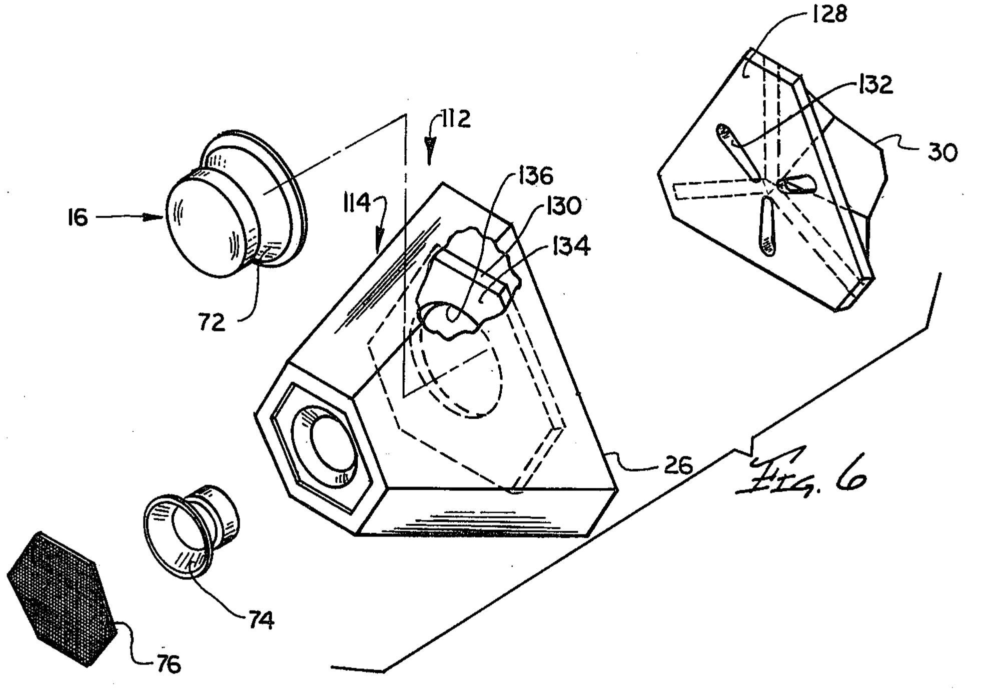
FIG. 6 is an exploded perspective view of a second embodiment of a loud speaker apparatus of this invention.

A second embodiment of this invention being a loud speaker apparatus 112 is shown in FIGS. 6 – 8, inclusive, having an altered housing means 114 and the identical speaker means 16. The housing means 114 includes the same housing assembly 26 and baffle assembly 30 but an altered housing door 128 and a separate speaker mount plate 130.

The housing door 128 is similar to the one previously described except the central area is formed with three tear drop shaped speaker openings 132 extended outwardly from a central point and separated by 120° radially.

The speaker mount plate 130 is of a similar peripherial shape as the housing door 128 having a main body 134 with a central opening 136 to which the full range driver speaker 72 is secured thereto in the position shown in FIG. 7. The mount plate 130 is of a size to fit within the housing means 114 spaced from the housing door 128 and having outer edge portions spaced inwardly of the housing means 114 (indicated by A) for proper sound wave movement as will be explained.

The loud speaker apparatus 112 may be tuned by changing the shape and size of the speaker openings 132 and/or by varying the distance between the housing door 128 and the speaker mount plate 130.

In the use and operation of the loud speaker apparatus 12 as shown in FIGS. 1 – 5, inclusive, the housing means 14 and speaker means 16 are to be assembled as shown in the exploded perspective view of FIG. 5. The baffle assembly 30 is mounted with the corner of a room (FIG. 2) to divide the room corner into three other corners each indicated at 139. The housing door 28 is mounted against the baffle assembly 30 such that each speaker opening 52 directs sound from the driver speaker 72 to respective corners 139. The tweeter speaker 74 directs sounds outwardly on a central line from the axis of the room corner.

In the use and operation of the second embodiment being the loud speaker apparatus 112, the same is assembled similar to the first embodiment except having a separate speaker mount plate 130 and openings at A to provide the ultimate in sound reproductions.

It is obvious that the loud speaker apparatus of this invention can be attached to the ceiling and/or walls by connector blocks, adhesives, or other conventional connecting means.

It is to be expected that the loud speaker apparatus of the present invention would improve upon the angular radiation characteristics of an ideal multi-cell horn of equivalent mouth and outer wall configuration. It should be pointed out that once the wave front has been formed to the desired radius of curvature, the wave acts as its own guide, needing no further deflectors. Many multi-cell applications become possible.

Adjustment of the frequency response of the unit may be accomplished by the changing of the taper rate of the horn by changing the angle of the baffle assembly. For example, the eight celled unit may be "tuned" by changing the cube created by the baffle assembly into a symmetrical 24 sided solid with all faces having the same rhombic shaped and sized pieces, and also having the same angle of incidence with each adjoining face of the baffle assembly.

When building a model of the unit using a 4½ inch full range speaker and using a 2½ inch tweeter speaker, one size is determined and the only type of cross-over used being a simple non-polar capacitor, when amplifying white sound with a pink sound filter on a single generator through a single unit and viewing the bodi graph on a real time analyzer attached to a calibrated microphone the curve appears pleasingly smooth. The unit faithfully reproduces all of the audio spectrum never being more than ± 10 db from 0. The point being that if by using the minimal amount of electronic assistance as far as crossovers and electronic equalizers and the unit reproduces all audible sound then the capabilities become endless. By increasing the size of the housing means and speaker means proportionally, therefore, lengthening the initial wave length of the sound wave and the size of horn proportionately, it would enhance the bass response of the loud speaker apparatus. The inverse and reverse also apply. The reverse being the use of a smaller unit where small listening enclosures necessitate the reproduction of sound, such as any vehicle. The inverse being the utilization of the unit as a microphone placing the diaphragm in place of the full range speaker either to pick up all of the sound within a given room enclosure or act as a directional non-feedbackable portable microphone horn.

It should be understood that the terms "inverse" and "reverse" are used to simplify terminology and not to imply any limitations in the positions in which the horn or horns may be used.

When realizing how the sound waves interact with the horn, one must first define some terms: Sound — a wave motion propagated in an elastic medium, traveling in both transverse and longitudinal directions, producing an auditory sensation in the ear by the change of pressure at the ear. Deflection — the sound waves deflect off the baffle and then deflect from off of the walls of the listening enclosure. Audible frequency range — 15 Hz to 20,000 hz. Hertz — the common term for measurements, when dealing with frequency, was in cycles per second, abbreviated C.P.S. In 1965, the term cycles per second was changed to hertz in honor of Heinrich Rudolph Hertz, an early German physicist. One cycle per second is stated 1 Hz. Eigentone — it is a resonance in an enclosure caused by the presence of parallel walls, which caused the generation of standing wave forms. A room of cubical dimensions (dimensions equal in all directions) would have the same resonant frequencies in all directions. This is why good acoustical design does not employ parallel walls, and uses given ratios for length, width and height. (1.51, page 16, *The Audio Cyclopedia* — Tremaine.)

Following the path of the sound waves produced by a full range driver speaker through the horn of the invention and understanding the diaphragm of the driver speaker the longer or lower frequency waves are formed closest to the rim of the driver speaker, therefore, passing through the slot farthest from the center of the three part orifice. The sound waves therefore strike the baffle assembly in a variable spectrum with the smallest waves remaining closer to the center of the baffle assembly.

After deflecting off of the baffle assembly, the sound waves then are deflected off of the adjacent walls with the bass waves reflecting with greatest magnitude. Considering the angle at which the sound waves deflect, it could be assumed that the sound waves "spill" into the room nine times the size of the wave made by the full range driver speaker. Because of the symmetrical qualities of the unit, the re-uniting of the sound waves from the three separate parts of the speaker apparatus always remain in phase and act together to complete the spherical nature of sound. The speaker apparatus could possible be described as a very nearly perfect quadrant — directional — exponential — folded speaker apparatus. Accordingly, the sound output remains reasonably constant.

From the horn throat area, immediately back of the slot or orifice, which is immeidately back of the full range driver speaker, the sound wave expands in the horn sections, the horn design is deliberately made so that the efficiency will drop with frequency rise, in order that the combined operation of the driver speaker and tweeter speaker may offer a reasonably flat response in the audible frequency range and in offering bass output of approximately the same intensity as that radiated through the tweeter speaker, in the front of the housing means.

A loud speaker system constructed and arranged according to the invention gives a wider tonal range than can be obtained from simple baffles and resonated enclosures of comparable size. It provides adequate loading of the driving unit diaphragm near the diaphragm suspension, effecting reduction of diaphragm excursion with resultant reduction in diaphragm distortion. Furthermore, reduced intermodulation distortion results from reduced diaphragm excursion, and the present invention thus reduces modulation distortion. It is particularly to be noted that reduction of diaphragm excursion is effected by imposing radiation resistance so that bass output is increased rather than reduced. Such results are realized in a simple and inexpensive manner in a speaker of small size.

While the invention has been described in conjunction with preferred specific embodiments thereof, it will be understood that this description is intended to illustrate and not to limit the scope of the invention, which is defined by the following claims.

I claim:

1. A loud speaker apparatus adapted to be mounted at the intersection of three mutually perpendicular walls, comprising:

(a) a housing means having a speaker means mounted therein;

(b) said housing means including a housing assembly, a baffle assembly connected to said housing assembly, and said housing means having an opening between said housing assembly and said baffle assembly;

(c) said baffle assembly including a corner connector assembly having three interconnected reflector plate members perpendicular to each other and mounted about the intersection of three mutually perpendicular walls, each of said reflector plate members to form a separate corner in conjunction with two adjacent ones of the perpendicular walls; and (d) said speaker means having a first speaker mounted in said housing assembly and directed through said opening toward said baffle assembly and said corners; whereby the sound waves from said first speaker are radiated from each of said corners from said corner connector assembly and the perpendicular walls producing balanced sound throughout the room.

2. A loud speaker apparatus as described in claim 1, wherein:

(a) said corner connector assembly having said three reflector plate members secured to each other in perpendicular planes to form a connector corner therebetween; and (b) said reflector plates secured against the perpendicular walls to form a cube therewith having said connector corner inside the cube.

3. A loud speaker apparatus as described in claim 1, wherein:

(a) said housing assembly including a plurality of interconnected primary sidewalls and secondary sidewalls of conical shape having a base with a large opening adjacent the perpendicular walls and a smaller opening at the opposite end; and (b) said speaker means having a second speaker directed outwardly of the perpendicular walls.

4. A loud speaker apparatus as described in claim 3, wherein:

(a) said first speaker is a full range driver speaker; and (b) said second speaker is a high range tweeter speaker.

5. A loud speaker apparatus as described in claim 1, wherein:

(a) said housing assembly of generally conical shape having a tapered central cavity;

(b) said housing means including a housing door secured to said housing assembly at a base of said cavity;

(c) said housing door having said opening divided into a plurality of speaker openings each cooperating with one of said separate corners of said corner connector assembly; and (d) said first speaker mounted adjacent said housing door about said speaker openings to direct sound waves toward said baffle assembly.

6. A loud speaker apparatus as described in claim 5, wherein:

(a) said speaker means having a second speaker mounted in said housing assembly adjacent a small opening of said cavity to direct sound waves outwardly therefrom.

7. A loud speaker apparatus as described in claim 1, wherein:

(a) said housing assembly of generally conical shape having a central tapered cavity; and (b) said housing means including a speaker mount plate secured to the inside of said housing assembly having said first speaker secured thereto to direct sound waves toward a housing door having said opening therein and secured to said housing assembly between said speaker mount plate and said baffle assembly.

8. A loud speaker apparatus as described in claim 7, wherein:

(a) said housing door having said opening divided into a plurality of speaker openings;

(b) each of said speaker openings cooperating with a respective one of said separate corners of said corner connector assembly to achieve maximum sound resonance; and (c) said speaker mount plate having outer peripheral portions spaced inwardly of said housing assembly to form openings for movement of sound waves from said first speaker.

* * * * *